United States Patent
Mayo et al.

(10) Patent No.: US 9,929,704 B2
(45) Date of Patent: Mar. 27, 2018

(54) CLASS E2 AMPLIFIER

(71) Applicant: QUALCOMM INCORPORATED, San Diego, CA (US)

(72) Inventors: Gabriel Isaac Mayo, North Potomac, MD (US); Charles Edward Wheatley, Del Mar, CA (US); Phuong Huynh, Fairfax, VA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/152,660

(22) Filed: May 12, 2016

(65) Prior Publication Data

US 2017/0170794 A1    Jun. 15, 2017

Related U.S. Application Data

(60) Provisional application No. 62/266,747, filed on Dec. 14, 2015.

(51) Int. Cl.
*H03F 3/217* (2006.01)
*H03F 1/56* (2006.01)
(Continued)

(52) U.S. Cl.
CPC .......... *H03F 3/2176* (2013.01); *H03F 1/565* (2013.01); *H03F 3/19* (2013.01); *H03F 3/193* (2013.01);
(Continued)

(58) Field of Classification Search
CPC . H03F 1/42; H03F 1/565; H03F 3/193; H03F 2200/216; H03F 2200/301; H03F 2200/451; H03F 3/195; H03F 2200/222; H03F 2200/38; H01L 23/66
(Continued)

(56) References Cited

U.S. PATENT DOCUMENTS 3,798,539 A    3/1974    Brooks et al.
4,717,884 A *  1/1988    Mitzlaff .................. H03F 3/217
                                                          330/251

(Continued)

FOREIGN PATENT DOCUMENTS

WO    2009060264 A1    5/2009

OTHER PUBLICATIONS

Eun S-K., et al., "Linearity Enhancement for the RF Class-E Power Amplifiers Using Duty-Cycle Modulation at the Feed-Forward Path," Proceedings of the 38th European Microwave Conference, Oct. 2008, pp. 1675-1678.

(Continued)

*Primary Examiner* — Khanh V Nguyen
(74) *Attorney, Agent, or Firm* — Smith Tempel Blaha, LLC

(57) ABSTRACT

An amplifier includes an amplifier circuit comprising a switch, the switch configured to provide an output signal responsive to an input signal, the output signal comprising a first output signal at a fundamental frequency and a second signal at a second harmonic of the fundamental frequency, the input signal configured to control the switch according to a nominal 25% off, 75% on cycle, a filter circuit configured to control an impedance presented to the amplifier circuit and a load circuit, at least a part of which is configured to combine with the filter circuit to form an impedance transformation circuit configured to be resonant at the second harmonic of the fundamental frequency.

34 Claims, 14 Drawing Sheets

(51) Int. Cl.
*H03F 3/193* (2006.01)
*H04B 1/04* (2006.01)
*H04B 5/00* (2006.01)
*H03F 3/19* (2006.01)
*H03F 3/24* (2006.01)

(52) U.S. Cl.
CPC ............... *H03F 3/217* (2013.01); *H03F 3/24* (2013.01); *H03F 3/245* (2013.01); *H04B 1/04* (2013.01); *H04B 5/0037* (2013.01); *H04B 5/0081* (2013.01); *H03F 3/2171* (2013.01); *H03F 3/2173* (2013.01); *H03F 2200/171* (2013.01); *H03F 2200/351* (2013.01); *H03F 2200/387* (2013.01); *H03F 2200/391* (2013.01); *H03F 2200/451* (2013.01); *H04B 2001/0408* (2013.01)

(58) Field of Classification Search
USPC .............................. 330/207 A, 251, 292, 302
See application file for complete search history.

(56) References Cited

U.S. PATENT DOCUMENTS

| 6,552,610 | B1* | 4/2003 | Grebennikov | .......... | H03F 3/217 |
| | | | | | 330/207 A |
| 6,724,255 | B2* | 4/2004 | Kee | .......... | H02M 7/48 |
| | | | | | 330/207 A |
| 7,151,408 | B2* | 12/2006 | Ziegler | .......... | H01J 37/32174 |
| | | | | | 330/207 A |
| 8,154,348 | B2* | 4/2012 | Honjo | .......... | H03F 1/56 |
| | | | | | 330/302 |
| 8,593,225 | B2* | 11/2013 | Hellberg | .......... | H03F 1/0205 |
| | | | | | 330/277 |
| 9,093,215 | B2* | 7/2015 | Low | .......... | H01F 38/14 |
| 2011/0051842 | A1 | 3/2011 | Van Der Heijden et al. | | |
| 2013/0293189 | A1 | 11/2013 | Low et al. | | |
| 2014/0340152 | A1 | 11/2014 | Banerjee et al. | | |
| 2014/0354356 | A1 | 12/2014 | Beltran Lizarraga | | |

OTHER PUBLICATIONS

International Search Report and Written Opinion—PCT/US2016/062131—ISA/EPO—dated Mar. 1, 2017 (157130WO).

Kazimierczuk M., et al., "Exact Analysis of Class E Tuned Power Amplifier at any Q and Switch Duty Cycle," IEEE Transactions on Circuits and Systems, Feb. 1, 1987 (Feb. 1, 1987), vol. 34(2), pp. 149-159, XP055347656, us ISSN: 0098-4094, DOI: 10.1109/TCS.1987.1086114.

* cited by examiner

CLASS E2 AMPLIFIER

RELATED APPLICATIONS

This application claims the benefit of U.S. Provisional Patent Application No. 62/266,747, entitled "Class E2 Amplifier," filed Dec. 14, 2015, the contents of which are hereby incorporated by reference in their entirety.

FIELD

The present disclosure relates generally power amplification. More specifically, the disclosure is directed to a class E2 power amplifier that can be used in a variety of applications, including wireless power transfer.

BACKGROUND

Amplifiers and amplifier circuits are used in many different applications. Amplifiers and amplifier circuits that operate efficiently and that are insensitive to variations in load are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier including an amplifier circuit comprising a switch, the switch configured to provide an output signal responsive to an input signal, the output signal comprising a first output signal at a fundamental frequency and a second output signal at a second harmonic of the fundamental frequency, the input signal configured to control the switch according to a nominal 25% off, 75% on cycle, a filter circuit configured to control an impedance presented to the amplifier circuit, and a load circuit, at least a part of which is configured to combine with the filter circuit to form an impedance transformation circuit configured to be resonant at the second harmonic of the fundamental frequency.

Another aspect of the disclosure provides an apparatus for wirelessly transmitting power via a wireless field, the apparatus including an amplifier circuit comprising a switch, the switch configured to provide an output signal responsive to an input signal, the output signal comprising a first output signal at a fundamental power transmit frequency and a second signal at a second harmonic of the fundamental power transmit frequency, the input signal configured to control the switch according to a nominal 25% off, 75% on cycle, a filter circuit, and a load circuit, wherein the filter circuit or at least part of the load circuit combined with the filter circuit forms an impedance transformation circuit configured to be resonant at the second harmonic of the fundamental power transmit frequency.

Another aspect of the disclosure provides a method for operating an amplifier, the method including providing an output signal responsive to an input signal, the output signal comprising a first output signal at a fundamental frequency and a second signal at a second harmonic of the fundamental frequency, the input signal comprising a nominal 25% off, 75% on cycle, circulating a first current in the amplifier at the fundamental frequency, and circulating a second current in the amplifier at a second harmonic of the fundamental frequency.

Another aspect of the disclosure provides a device including means for providing an output signal responsive to an input signal, the output signal comprising a first output signal at a fundamental frequency and a second signal at a second harmonic of the fundamental frequency, the input signal comprising a nominal 25% off, 75% on cycle, means for circulating a first current at the fundamental frequency, and means for circulating a second current at a second harmonic of the fundamental frequency.

Another aspect of the disclosure provides an amplifier circuit for driving a load circuit, the amplifier circuit including a switching circuit configured to switch between a conductive state and a non-conductive state responsive to an input signal, the switching circuit electrically connected between a choke inductor in series with a voltage source and a ground connection, the switching circuit configured to provide an output signal responsive to an input signal, an input circuit electrically coupled to the switching circuit and configured to generate the input signal, the input signal generated to be an oscillating signal at a fundamental frequency having a substantially nominal 25% off, 75% on cycle, and an impedance transformation circuit electrically coupled between a node that is between the switching circuit and the choke inductor and the load circuit, at least a portion of the impedance transformation circuit configured to form a resonant circuit that is resonant at a second harmonic of the fundamental frequency.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral may encompass all parts having the same reference numeral in all figures.

Figure 1:
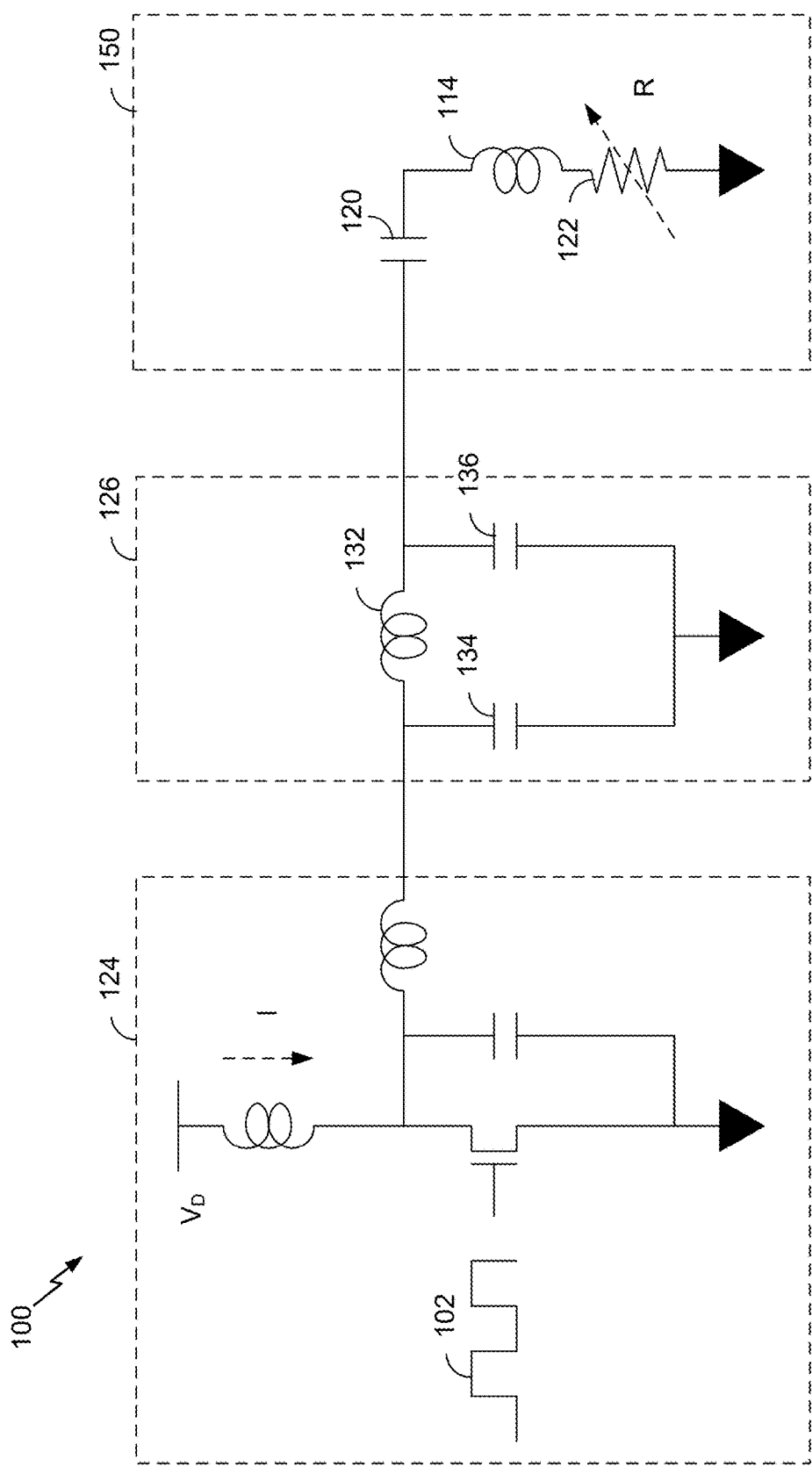
FIG. 1 is a schematic diagram of a portion of circuitry that may include an amplifier circuit.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The disclosure describes a new class of amplifier, referred to as a class E2 amplifier that can be implemented to leverage the second harmonic of an input signal instead of the fundamental frequency of the input signal to satisfy wave shape requirements.

In certain applications, amplifier circuits, referred to as 'class E' amplifier circuits are used to drive loads. For example, certain wireless power/charging systems may use class E amplifier circuits to drive a transmit antenna that may output energy for wirelessly coupling by one or more receivers (e.g., via driving the transmit antenna such as a coil with an alternating current to generate a magnetic field for inductively coupling power). More particularly, as an example, wireless charging systems achieve relatively high coupling by using transmitter and receiver coils tuned at or near resonance. Tuning the transmit and receive coils to a resonant frequency allows relatively high power transfer efficiencies without sacrificing device placement freedom or device size freedom. Further, it is desirable to maintain sufficient receiver power output while accommodating a wide variation in coupling and detuning effects due to variable positioning or other changing environmental conditions. Variable coupling and detuning effects cause changes in impedance and other characteristics at the transmit antenna.

These impedance changes are reflected/presented to the circuit, such as a class E amplifier circuit, driving the transmit antenna. This may create difficulties in class E amplifier circuit design for efficiently driving such a load or other similar loads in various operating environments. For example, class E amplifiers may have a limited reactance range of which the amplifier is within a certain range of efficiency. The limitation on reactance range is due, at least in part, to reflected impedance from the load, significantly affecting the transmit wave shape at the transistor that forms the driver circuit of the power amplifier.

Switchable or adjustable series reactance shifting networks may be used to at least somewhat alleviate the limited reactance range by operating the power amplifier over a narrower reactance range. This solution, however, may increase the number of components and may increase the cost of the amplifier or present other tradeoffs for configuring the amplifier circuit.

In an exemplary embodiment, a new class of amplifier, referred to as a class E2 amplifier, can be implemented to leverage the second harmonic of a transmit signal instead of the fundamental frequency of the transmit signal to satisfy wave shape requirements. Satisfying wave shape requirements refers to the waveform output of the amplifier returning to zero to satisfy a zero voltage switching (ZVS) condition. For example, one advantage of using the second harmonic of the power transmit signal to satisfy wave shape requirements is that the ZVS condition can be met over a significantly wider range of load impedances as compared to other configurations of class E or F amplifiers.

FIG. 1 is a schematic diagram of a portion of circuitry 100 that may include an amplifier circuit. The circuitry 100 may include an amplifier circuit 124, which may be a switching amplifier that may be configured to receive a square wave and output a sine wave to be provided to a load circuit 150. The amplifier circuit 124 is shown as a class E amplifier, however, as will be described in greater detail below, the operation of the class E amplifier may be modified to what is referred to herein as class E2 in accordance with exemplary embodiments described herein, to improve amplifier performance. The amplifier circuit 124 may be driven by an input signal 102 from an oscillator (not shown). The amplifier circuit 124 may also be provided with a drive voltage $V_D$ that is configured to control the maximum power that may be delivered through the load circuit 150. To eliminate or reduce harmonics, the circuitry 100 may include a filter circuit 126. The filter circuit 126 may be a three pole (capacitor 134, inductor 132, and capacitor 136) low pass filter circuit 126, or any other filter circuit.

The signal output by the filter circuit 126 may be provided to a load circuit 150. In a wireless power transfer embodiment, the load circuit may comprise an antenna 114. The load circuit 150 may include a series resonant circuit having a capacitance 120 (e.g., that may be due to the capacitance of the antenna or to an additional capacitor component) and inductance (e.g., that may be the inductance of the antenna) that may resonate at a frequency of the filtered signal provided by the amplifier circuit 124. The load of the load circuit 150 may be represented by the variable resistor 122. However, it is appreciated that the load circuit 150 may be any one of a variety of circuits that are driven by the amplifier circuit 124 and the components shown in the load circuit 150 are for purposes of illustration with regards to FIG. 1. In addition, in a wireless power application, where the load circuit may be a resonator for generating a magnetic field, the load of the load circuit represented by the variable resistor 122 may be the variation in load presented to the load circuit via one or more receivers coupling power via a magnetic field and thus changing the impedance at the resonator.

Figure 2:
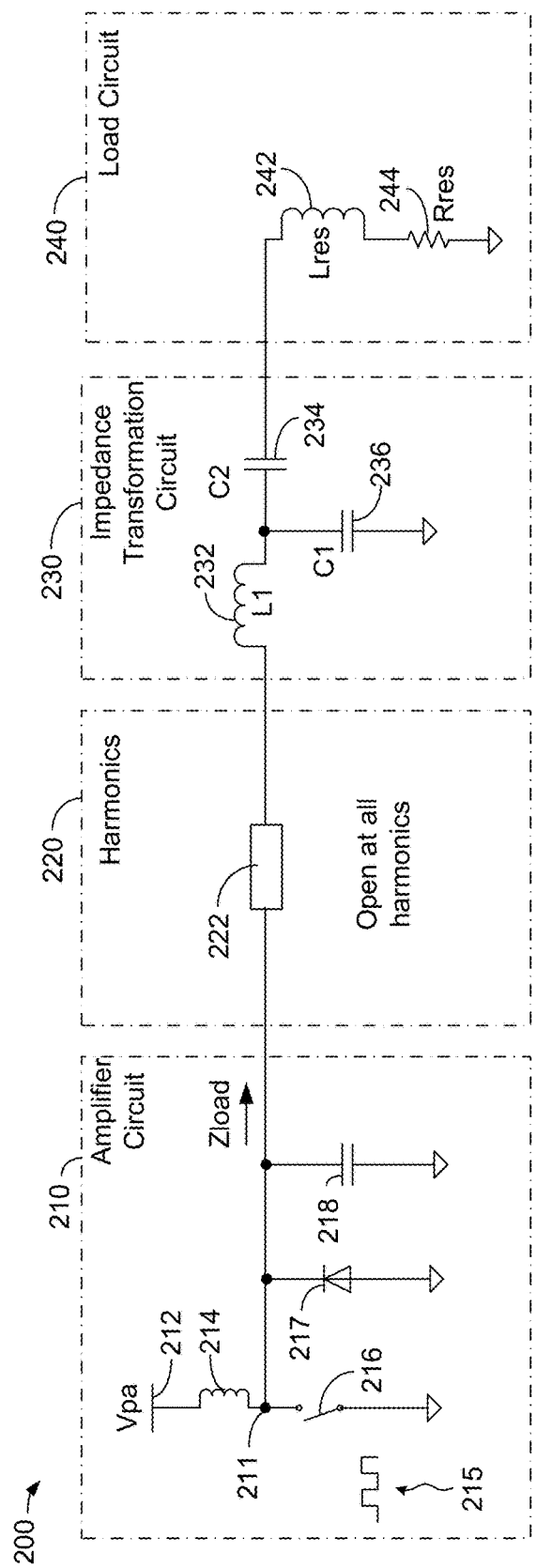
FIG. 2 is a block diagram showing transmit circuitry using a class E amplifier circuit for a wireless power application.

FIG. 2 is a block diagram showing transmit circuitry 200 using a class E amplifier circuit for a wireless power application. The transmit circuitry 200 comprises an amplifier circuit 210, an impedance transformation circuit 230 and a load circuit 240. The transmit circuitry 200 also comprises a harmonics element 220. In a class E amplifier circuit 210 configured to operate at the fundamental frequency f1, the harmonics element 220 can be generally characterized by a function 222 that is an open circuit at all harmonics of the fundamental frequency, f1. As an example, the fundamental frequency, f1, may be a fundamental power transfer frequency of, for example, 6.78 MHz.

The amplifier circuit 210 comprises a switch 216 coupled to a node 211. The node 211 is also coupled to a voltage source, Vpa (V power amplifier), 212 through an inductor 214. The inductor 214 may be referred to as Lchoke. The switch 216 may comprise a semiconductor switch, and may comprise one or more transistors fabricated using any of a variety of technologies. In an exemplary embodiment, the diode 217 may comprise the body diode of a transistor that comprises the switch 216. The amplifier circuit 210 may also comprises a shunt capacitance 218. The capacitance 218 may comprise the capacitance of the switch 216, may comprise a capacitance that is greater than the capacitance of the switch 216, or may comprise a variable capacitance. The capacitance 218 may be referred to as a shunt capacitance, Cs.

The impedance transformation circuit 230 comprises inductor L1 232, a first capacitor C1 236, a second capacitor C2 234, and part or all of inductor 242.

The load circuit 240 comprises part or all of inductor 242 and a resistor 244. The load circuit 240 may comprise some or all of a resonant circuit, and if configured as a resonant circuit, may also be referred to as a resonator. If the load circuit 240 is part of a resonant circuit, the inductor 242 may be referred to as Lres and the resistor 244 may be referred to as Rres. The resistor 244 may comprise the resistance of the inductor 242 as well as the magnetically coupled load in the load circuit 240.

An input signal 215 may be provided to the switch 216. In accordance with class E operation, the input signal 215 may comprise a signal that may control the switch 216 to be off (open, or non-conductive) approximately 50% of the cycle of the input signal 215, and may control the switch 216 to be on (closed, or conductive) approximately 50% of the cycle of the input signal 215. This on/off cycle can also be referred to as a nominal 50% duty cycle. The class E amplifier circuit 210 may characterized by having an optimal load, Zload, that is inductive at the fundamental frequency, f1, and that presents high impedance to the amplifier circuit 210 at all harmonics of the fundamental frequency, f1. The function 222 being generally open at harmonics of the fundamental frequency, f1 is generally achieved by the use of resonant networks. The waveshape of the amplifier circuit 210 approximates a half sine wave with a 50% on/off cycle.

Figure 3:
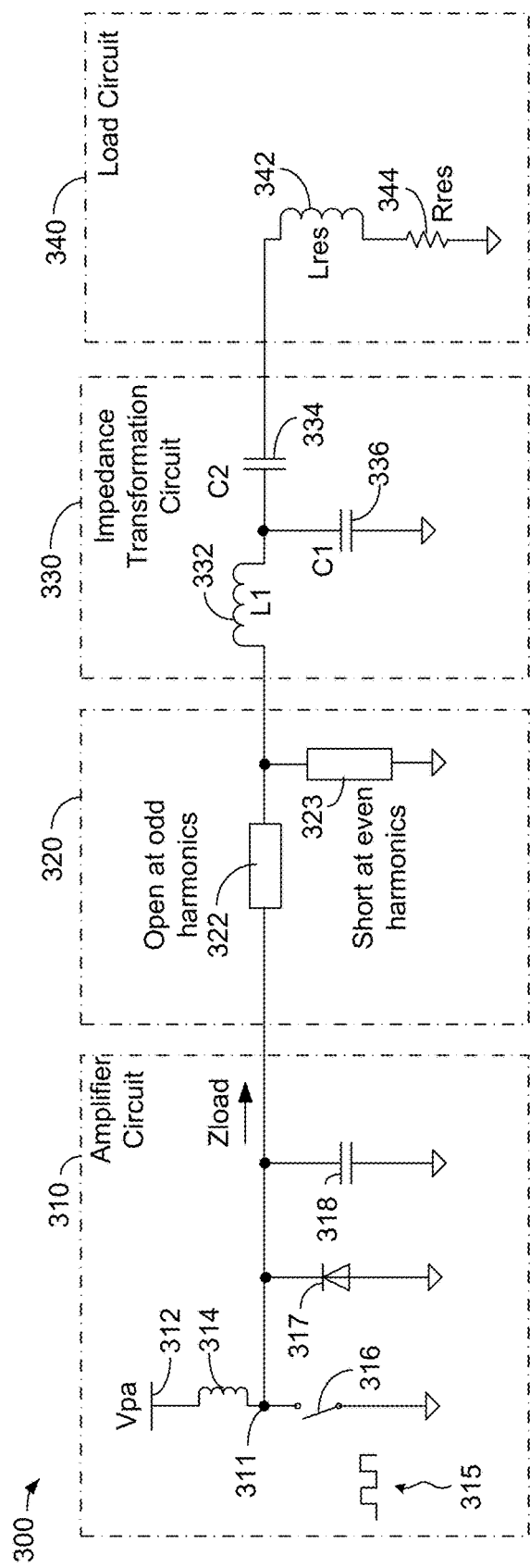
FIG. 3 is a block diagram showing transmit circuitry using a class F amplifier circuit for a wireless power application.

FIG. 3 is a block diagram showing transmit circuitry 300 using a class F amplifier circuit for a wireless power application. The transmit circuitry 300 comprises an amplifier circuit 310, an impedance transformation circuit 330 and a load circuit 340. The transmit circuitry 300 also comprises a harmonics element 320. In a class F amplifier circuit 310 configured to operate at the fundamental frequency f1, the harmonics element 320 can be generally characterized by a function 322 that is an open circuit at odd harmonics of the fundamental frequency, f1 and a function 323 that is a short circuit at even harmonics of the fundamental frequency, f1, reflecting even harmonic energy back to the switch. The fundamental frequency, f1, may be a fundamental power transfer frequency of, for example, 6.78 MHz.

The amplifier circuit 310 comprises a switch 316 coupled to a node 311. The node 311 is also coupled to a voltage source, Vpa (V power amplifier) 312 through an inductor 314. The inductor 314 may be referred to as Lchoke. The switch 316 may comprise a semiconductor switch, and may comprise one or more transistors fabricated using any of a variety of technologies. In an exemplary embodiment, the diode 317 may comprise the body diode of a transistor that comprises the switch 316. The amplifier circuit 310 may also comprises a shunt capacitance 318. The capacitance 318 may comprise the capacitance of the switch 316, may comprise a capacitance that is greater than the capacitance of the switch 316, or may comprise a variable capacitance. The capacitance 318 may be referred to as a shunt capacitance, Cs.

The impedance transformation circuit 330 comprises inductor L1 332, a first capacitor C1 336, a second capacitor C2 334, and part or all of inductor 342.

The load circuit 340 comprises part or all of inductor 342 and a resistor 344. The load circuit 340 may comprise some or all of a resonant circuit, and if configured as a resonant circuit, may also be referred to as a resonator. If the load circuit 340 is part of a resonant circuit, the inductor 342 may be referred to as Lres and the resistor 344 may be referred to as Rres. The resistor 344 may comprise the resistance of the inductor 342 as well as the magnetically coupled load in the load circuit 340.

An input signal 315 may be provided to the switch 316. In accordance with class F operation, the input signal 315 may comprise a signal that may control the switch 316 to be off (open, or non-conductive) approximately 50% of the cycle of the input signal 315, and may control the switch 316 to be on (closed, or conductive) approximately 50% of the cycle of the input signal 315. The class F amplifier circuit 310 may characterized by having an optimal load, Zload, that is inductive at the fundamental frequency, f1, and that presents high impedance to the amplifier circuit 310 at odd harmonics of the fundamental frequency, f1 and that presents a low impedance to the amplifier circuit 310 at even harmonics fundamental frequency, f1. The function 322 being generally an open circuit at odd harmonics and the function 323 being generally a short circuit at even harmonics is generally achieved by the use of resonant networks. The waveshape of the amplifier circuit 310 approximates a rectangular wave with a 50% on/off cycle.

Figure 4:
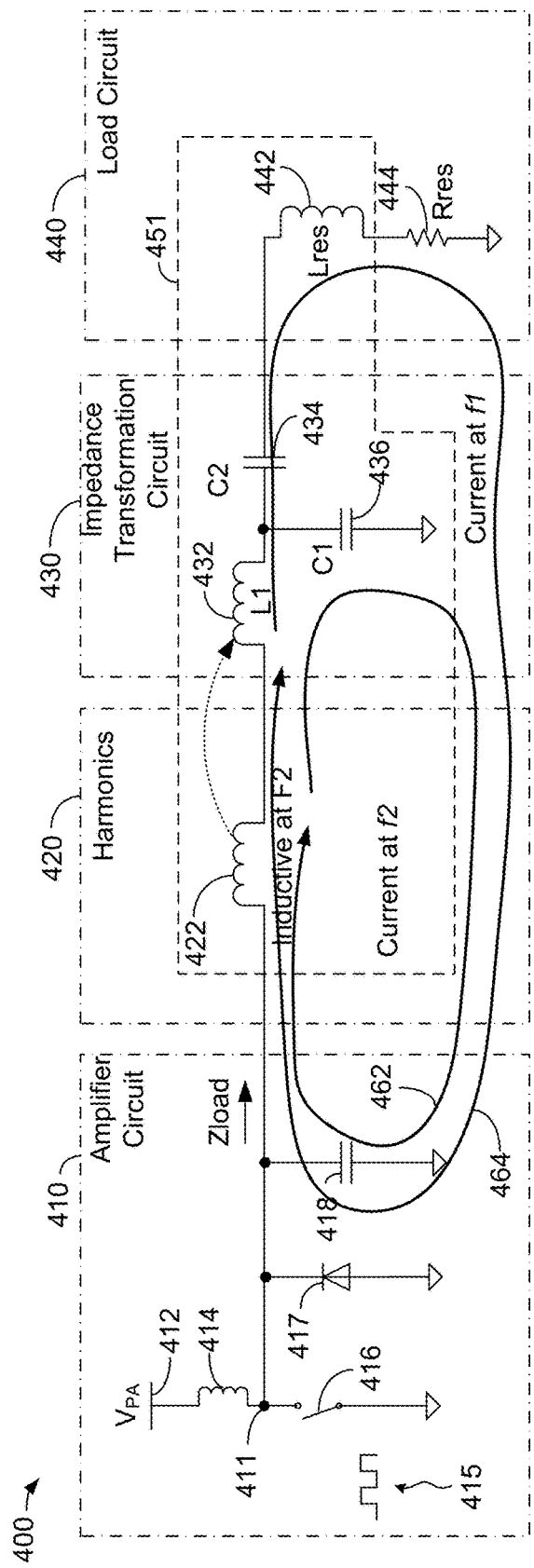
FIG. 4 is a block diagram showing an exemplary embodiment of circuitry using a class E2 amplifier circuit.

FIG. 4 is a block diagram showing an exemplary embodiment of circuitry 400 using a class E2 amplifier circuit. In an exemplary embodiment, the circuit 400 may comprise part of transmit circuitry for a wireless power transfer application; however, the amplifier circuit described in FIG. 4 is applicable to any amplifier application in which the effects of load variation are sought to be minimized and where a predominantly positive load reactance at the second harmonic is desired. The term "class E2 amplifier circuit" will be used interchangeably with the term "class E2 driver" or "class E2 driver circuit."

The transmit circuitry 400 comprises an amplifier circuit 410, an impedance transformation circuit 430 and a load circuit 440. The transmit circuitry 400 also comprises a harmonics element 420; however, while shown as a distinct physical inductance element 422, in a practical implementation, the harmonics element 420 may also comprise the inductance of the inductor 422 optionally series combined with an inductance of an inductor 432 as a single element having the sum of the two inductances 422 and 432. In an exemplary embodiment, e.g., for wireless power applications, the fundamental frequency, f1, may be a fundamental power transfer frequency of, for example, 6.78 MHz and the second harmonic, f2, thereof may be at a frequency of 13.56 MHz. In an exemplary embodiment, the amplifier circuit 410 may be configured as a class E2 amplifier configured to operate at the second harmonic, f2, of the fundamental frequency. It should be appreciated that other fundamental frequencies and second harmonics are also contemplated.

In an exemplary embodiment, the amplifier circuit 410 comprises a switch 416 coupled to a node 411. The node 411 is also coupled to a voltage source, $V_{PA}$ (V power amplifier) 412 through an inductor 414. The inductor 414 may be referred to as Lchoke. In an exemplary embodiment, the switch 416 may comprise a semiconductor switch, and may comprise one or more transistors fabricated using any of a variety of technologies. The amplifier circuit 410 also comprises an optional diode 417 and a shunt capacitance 418. In an exemplary embodiment, the diode 417 may comprise the body diode of a transistor that comprises the switch 416. The capacitance 418 may comprise the capacitance of the switch 416, may comprise a capacitance that is greater than the capacitance of the switch 416, or may comprise a variable capacitance. In an exemplary embodiment, the capacitance 418 may be referred to as a shunt capacitance, Cs.

In an exemplary embodiment, the impedance transformation circuit 430 may comprise a filter circuit comprising the inductance of the inductor 422, the inductor L1 432, a first capacitor C1 436, a second capacitor C2 434, and part or all of inductor 442.

In an exemplary embodiment, the load circuit 440 comprises part or all of inductor 442 and a resistor 444. In an exemplary embodiment, the load circuit 440 may comprise some or all of a resonant circuit, and in an exemplary embodiment, may also be referred to as a resonator. In an exemplary embodiment in which the load circuit 440 is part of a resonant circuit, the inductor 442 may be referred to as Lres and the resistor 444 may be referred to as Rres. The resistor 444 may comprise the resistance of the inductor 442 as well as a magnetically coupled load in the load circuit 440.

In an exemplary embodiment, an input signal 415 may be provided to the switch 416. In an exemplary embodiment, the input signal 415 may comprise a signal that may control the switch 416 to be off (open, or non-conductive) approximately 25% of the cycle of the input signal 415, and may control the switch 416 to be on (closed, or conductive) approximately 75% of the cycle of the input signal 415. This is referred to as a nominal 25% duty cycle. A nominal 25% duty cycle may include a duty cycle where the switch 416 may be off (open, or non-conductive) approximately 20% or less of the cycle of the input signal 415, and where the switch 416 may be on (closed, or conductive) approximately 70% or more of the cycle of the input signal 415. In an exemplary embodiment, the input signal 415 may comprise a transmit signal at a fundamental power transmit frequency, f1.

In an exemplary embodiment, the impedance presented at Zload, interfacing at the inductor 422 represents an operative state in which the harmonics element 420 is resonant with capacitance 418 at approximately the second harmonic (f2) of the fundamental frequency, f1. In an exemplary embodiment, the fundamental frequency, f1, may be 6.78 MHz and the second harmonic thereof may be at a frequency of 13.56 MHz.

In an exemplary embodiment, the circuit comprising the inductor 422, the inductor L1 432, the first capacitor C1 436, the second capacitor C2 434, together with at least a part of the inductor 442 form a ¼ wave transformation circuit 451 at the fundamental frequency, f1. Additionally, the ¼ wave transformation circuit 451 together with the capacitance 418 in the amplifier circuit 410 also forms a resonant circuit at approximately the second harmonic, f2, of the fundamental frequency, f1. This second harmonic resonance substantially contributes to satisfy zero voltage switching (ZVS) conditions at the nominal 25% switching point.

In an exemplary embodiment, at the second harmonic, f2, of the fundamental frequency, f1, the inductor 442 is characterized predominantly as a positive reactance. Compared with the impedance at the fundamental frequency, f1, at the second harmonic, f2, the reactance of inductor L1 432 doubles, the reactance of the first capacitor C1 436 is halved, and the coupling of the amplifier circuit 410 to the load circuit 440 is greatly diminished in terms of impedance variation presented to the amplifier circuit 410. Therefore, at a given load, the impedance presented to the amplifier circuit 410 is dominated by impedances at f2 and less impacted by load variations at the ¼ wave transformation circuit 451. The impedance transformation circuit 430 strongly couples the resonator impedance to $Z_{LOAD}$ at the fundamental, f1, but weakly couples the resonator impedance to $Z_{LOAD}$ at harmonics, such as at f2. This makes the second harmonic current relatively insensitive to resonator impedance, and consequentially makes the waveshape at the switch less sensitive to output load variations at the fundamental frequency, f1.

The inductance of the representative inductor 422 can be combined as part of the total inductance of the ¼ wave transformation circuit 451 at the second harmonic, f2, of the fundamental frequency, f1, such that with an approximate nominal 25% off/75% on cycle, a current is circulated through the transmit circuitry 400 at the second harmonic, f2, of the fundamental frequency, f1. The current that circulates through the transmit circuitry 400 at the second harmonic, f2, is represented by the current loop 462, whereby the current at f2 substantially passes through the circuitry comprising the capacitor 418, the inductor 432 and the capacitor 436. The current at f2 shown by the current loop 462 is substantially attenuated to the resistor 444, thus minimizing output energy at the second harmonic f2 of the fundamental frequency.

In an exemplary embodiment, controlling the switch 416 using an approximate nominal 25% off/75% on cycle, together with choosing the values of the capacitor 418, inductor 422, inductor L1 432, and first capacitor C1 436 to be resonant at the second harmonic, f2, of the fundamental frequency, f1, allows a return current, shown by the current loop 462, to circulate as stored energy through the transmit circuitry 400 at the second harmonic, f2. Circulating a return current through the transmit circuitry 400 at the second harmonic, f2, substantially improves efficiency and allows a significantly wider reactance range as compared to certain other configurations of class E or class F amplifiers. While the current at the second harmonic, f2, primarily circulates through the transmit circuitry 400 as shown by the current loop 462, a current also circulates through the transmit circuitry 400 at the fundamental frequency, f1. The current that circulates through the transmit circuitry 400 at the fundamental frequency, f1, is represented by the current loop 464, whereby the current at f1 substantially passes through the circuitry comprising the capacitor 418, the inductor 422, the inductor 432, the capacitor 434, the inductor 442 and the resistor 444. In this manner, in an exemplary embodiment, a power transmit signal at the fundamental frequency, f1, shown by the current loop 464, is wirelessly transmitted by the inductor 442 and the resistor 444.

In an exemplary embodiment, the switch 416 is presented with a resonance at the second harmonic f2 that minimally couples the amplifier circuit 410 to the load circuit 440 (shown by current loop 462 not circulating current in the inductor 442 or the resistor 444), thus serving to shape the switching waveform with what is referred to as "zero voltage switching" qualities. In contrast, the f1 current component is strongly coupled to the output for the purpose of delivering RF power at f1 (shown by the current loop 464 that circulates current in the inductor 442 and the resistor 444). Topologically, the f2 current component is primarily reflected back to the switch 416 at the capacitor 436, thus forming a moderately high Q resonance toward the switch 416 in the current loop 462 and significantly attenuating the f2 component toward the inductor 442 and the resistor 444.

The class E2 amplifier circuit 410 may characterized by having an optimal load, Zload, that is inductive at the fundamental frequency, f1, and at the second harmonic, f2, of the fundamental frequency, f1. The waveshape of the amplifier circuit 410 approximates a half-sine wave with an approximate nominal 25% off/75% on cycle.

Figure 5A:
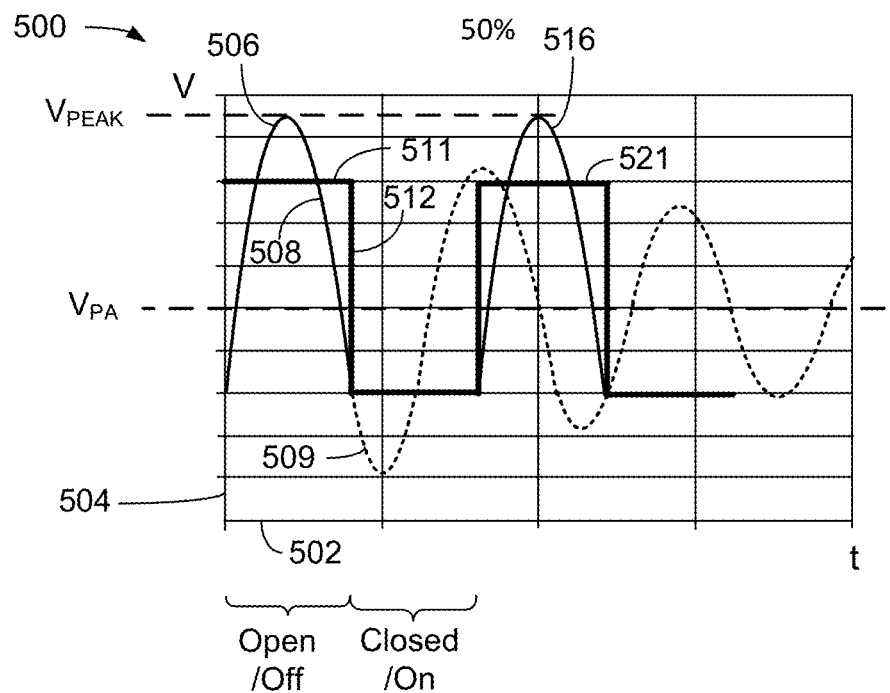
FIG. 5A is a graphical diagram showing an output waveform of a class E amplifier circuit.

FIG. 5A is a graphical diagram 500 showing an output waveform of an exemplary class E amplifier circuit. The horizontal axis 502 shows time increasing to the right and the vertical axis 504 shows the voltage at node 211 (FIG. 2). The waveform 506 has a first portion 508 shown in solid line that shows the voltage at the node 211 when the switch 216 is open, or non-conductive, and has a second portion 509 shown in dotted line that shows the voltage at the node 211 had the switch 216 remained open. The switching period of one cycle of the switch 216 is shown using reference numeral 511. The time 512 illustrates a switching time at which the switch 216 transitions from being open, or non-conductive, to being closed, or conductive. The second portion 509 of the waveform 506 illustrates the natural decay of the waveform 506 to the voltage $V_{PA}$ had the switch 216 not been closed at time 512. The waveform 516 and switching period 521 show the voltage at node 211 for a subsequent cycle with the portion of the waveform 516 as normal operation. The second portion 509 of the waveform 506 can exhibit a relatively fast decay to $V_{PA}$ because at the fundamental frequency, substantial energy from the amplifier circuit 210 is lost to the load resistor 244.

Figure 5B:
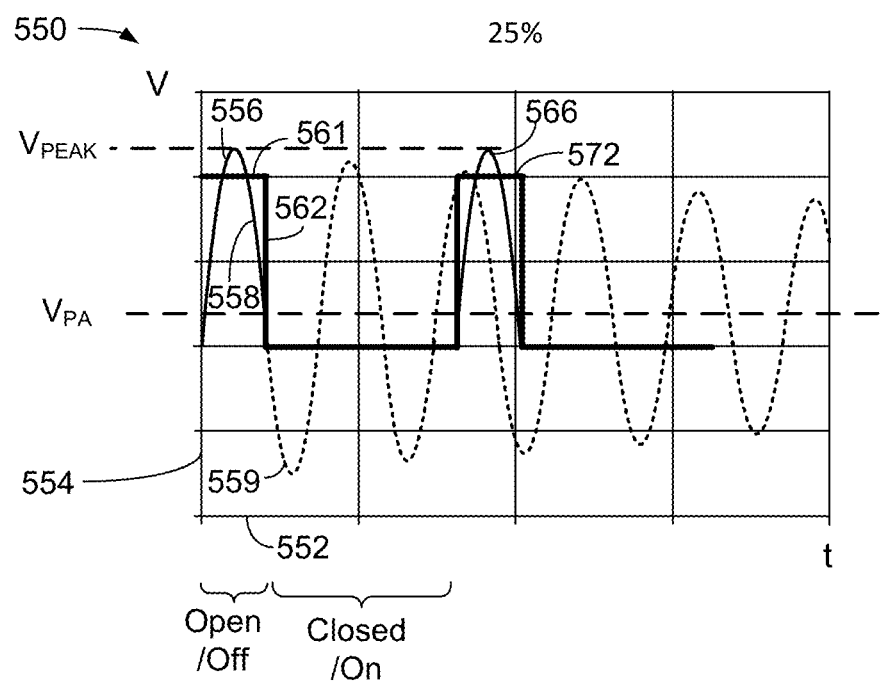
FIG. 5B is a graphical diagram showing an output waveform of a class E2 amplifier circuit.

FIG. 5B is a graphical diagram 550 showing an output waveform of an exemplary class E2 amplifier circuit. The horizontal axis 552 shows time increasing to the right and the vertical axis 554 shows the voltage at node 411 (FIG. 4). The waveform 556 has a first portion 558 that shows the voltage at the node 411 when the switch 416 is open, or non-conductive, and has a second portion 559 that shows the voltage at the node 411 had the switch 416 remained open. The switching period of one cycle of the switch 416 is shown using reference numeral 561. The time 562 illustrates a switching time at which the switch 416 transitions from being open, or non-conductive, to being closed, or conductive. The second portion 559 of the waveform 556 illustrates the decay of the waveform 556 to $V_{PA}$ had the switch 416 not been closed at time 562, and shows a relatively slower time constant as compared to the second portion 509 of the waveform 506 of FIG. 5A. The waveform 566 and switching period 572 show the voltage at node 411 for a subsequent cycle with the portion of the waveform 566 as normal operation. The slower decay of the waveform portion 559 illustrates lower losses at the second harmonic (f2) as the current at the second harmonic, f2, is minimally coupled to the load circuit 440, and is instead substantially circulated in the amplifier circuit 410 as described above. Using the second harmonic of the fundamental frequency to satisfy wave shape requirements and allowing the zero voltage switching (ZVS) condition to be met over a significantly wider range of load impedances as compared to other configurations of class E or F amplifiers because, at the second harmonic of the fundamental frequency, minimal power is lost to the load, represented by the inductor 442 and the resistor 444 of FIG. 4, leads to lower losses and slower voltage decay to $V_{PA}$ as mentioned above. The waveforms 506 and 516 of FIG. 5A and the waveforms 556 and 566 of FIG. 5B are illustrative examples of the switching characteristics of a class E and a class E2 amplifier circuit, respectively, at a particular load and are subject to differences based on a number of factors including, for example only, load, the amount of loss in the circuitry, and other factors.

Figure 6:
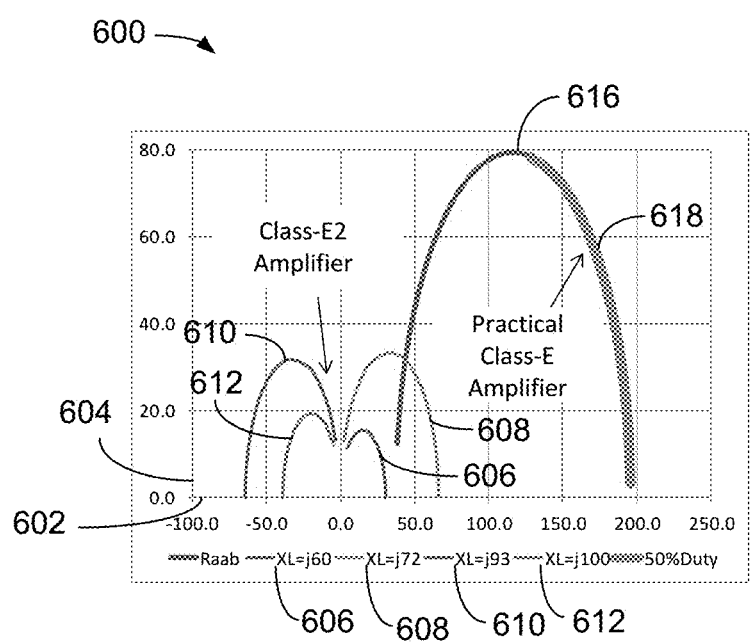
FIG. 6 is a graphical diagram comparing theoretical 100% efficiency contours of a class E and a class E2 amplifier circuit.

FIG. 6 is a graphical diagram 600 comparing theoretical 100% efficiency contours of a class E and a class E2 amplifier circuit. The horizontal axis 602 shows Zload reactance (jXL) and the vertical axis 604 shows Zload resistance (RL).

The trace 606 shows the 100% efficiency contour of a class E2 amplifier when XL (load reactance)=j60; the trace 608 shows the 100% efficiency contour of a class E2 amplifier when XL=j72; the trace 610 shows the 100% efficiency contour of a class E2 amplifier when XL=j93; and trace 612 shows the 100% efficiency contour of a class E2 amplifier when XL=j100.

The trace 616 shows the 100% efficiency contour of a class E amplifier for reference with zero circulating current at harmonics of the fundamental frequency. The right-hand portion 618 of the trace 616 shows the practical efficiency of a class E amplifier with circulating current at second and higher harmonics.

As shown, the traces 606, 608, 610 and 612 are all substantially centered around the zero (0) reactance point, showing that there is a +/− reactance range associated with the class E2 amplifier within which the class E2 amplifier may efficiently operate. In an exemplary embodiment, a Class E2 amplifier operates at a nominal 25% duty cycle, where the switch (416, FIG. 4) conducts approximately 75% of the cycle and is off approximately 25% of the cycle, thus achieving optimum performance when the impedance at the load, $Z_{LOAD}$, is centered at j0, thus supporting a +/− reactance range predominantly centered around the j0 point. The class E2 amplifier shifts the operating point where maximum efficiency is achieved at the center of the reactance range rather than the upper end of the reactance range, as shown by the trace 616. The class E2 amplifier supports a proportionally much wider reactance operating range compared to Class E and F amplifiers and also operates at a comparatively low input resistance, making it ideal for low voltage power supply operation. The class E2 design is based on the premise that fundamental and $2^{nd}$ harmonic current are intentionally presented at $Z_{LOAD}$ with exemplary embodiments as described above.

Figure 7:
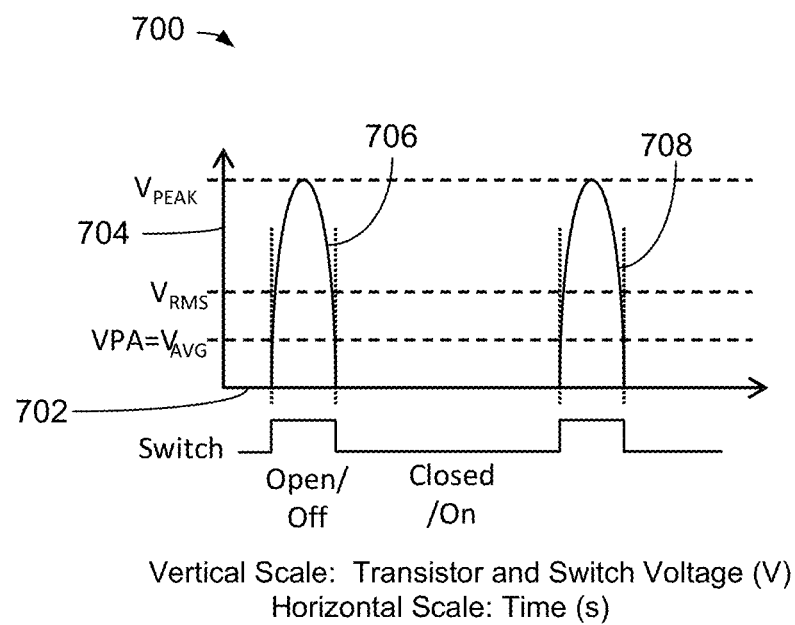
FIG. 7 is a graphical diagram showing an output waveform of the class E2 amplifier circuit of FIG. 4.

FIG. 7 is a graphical diagram 700 showing an output waveform of the class E2 amplifier circuit of FIG. 4. The horizontal axis 702 shows time increasing to the right and the vertical axis 704 shows the voltage at node 411 (FIG. 4). The pulses 706 and 708 illustrate the periods of time when the switch 416 (FIG. 4) is open (non-conductive).

The load inductance formed by the ¼ wave transformation circuit 451 (FIG. 4) at the second harmonic, f2, of the fundamental frequency, f1 in parallel with the capacitance $C_S$ 418 sets a waveform that forms a near half sine wave, which intercepts zero voltage at a nominal 25% duty cycle (the switch 416 is off approximately 25% of the time). In this way the waveform is substantially satisfied by the second harmonic and only secondarily affected by load impedance at the fundamental. In contrast, certain class E and class F amplifiers substantially satisfy the waveform requirements at the fundamental frequency, where second harmonic current degrades the shape of the waveform away from optimal performance.

Figure 8:
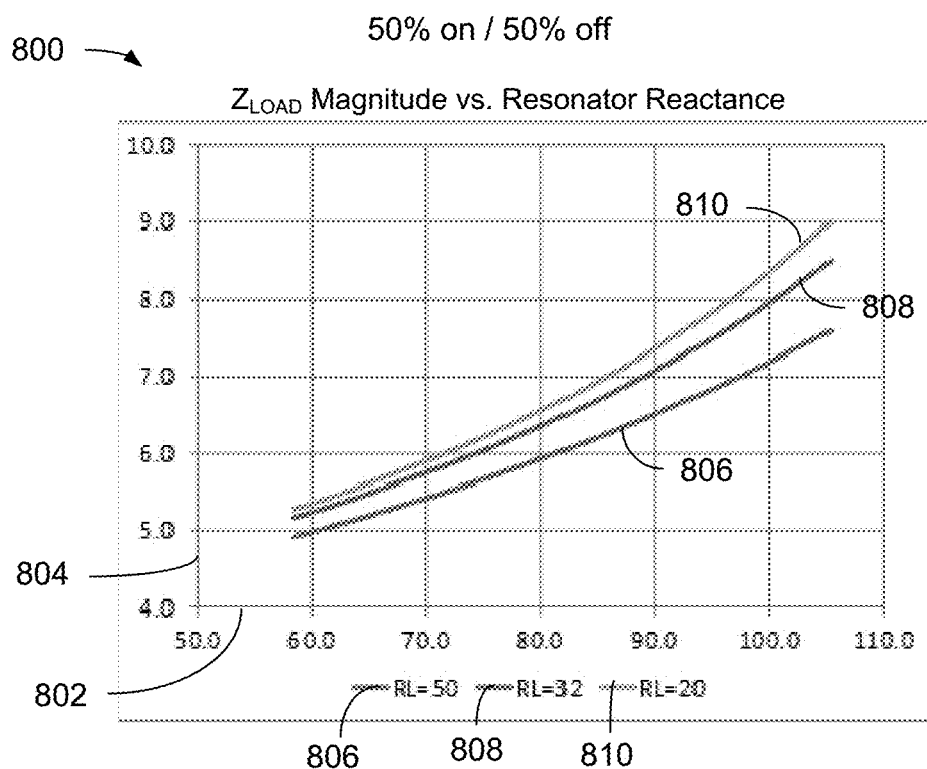
FIG. 8 is a graphical diagram showing the magnitude of the impedance presented to the amplifier circuit, Zload as a function of load resistance and resonator impedance of a class E amplifier.

FIG. 8 is a graphical diagram 800 showing the magnitude of the impedance presented to the amplifier circuit 210, Zload as a function of load resistance and resonator impedance of a class E amplifier, where load magnitude is not centered and provides differing voltage and current stresses at each extreme of Zload reactance.

The horizontal axis 802 shows the reactance of the resonator in the load circuit 240 (FIG. 2) and the vertical axis 804 shows the impedance of the load (Zload). The trace 806 shows the load impedance when RL (load resistance)=50 ohms; the trace 808 shows the load impedance when RL=32 ohms; and the trace 810 shows the load impedance when RL=20 ohms.

The graph 800 illustrates the magnitude of $Z_{LOAD}(j\omega_0)$ at the fundamental frequency (6.78 MHz) as a function of resonator reactance (XL) ranging from XL=58.5jΩ− 105.4jΩ for three different load resistances, RL, based on a nominal 50% duty cycle design, representing class E amplifier operation. The graph 800 shows that for all three cases of RL, the highest impedance occurs at the high range of XL, while the lowest impedance occurs at the low range of XL.

A high load impedance translates to low circulating currents at the transistor (switch 216) and RF inductor 214, while a low load impedance translates to higher circulating currents.

Therefore, as illustrated by on FIG. 8, the circulating currents are highest at low resonator reactance (XL), resulting in higher losses in the transistor (switch 416) and higher winding loss in the RF inductor 214.

Figure 9:
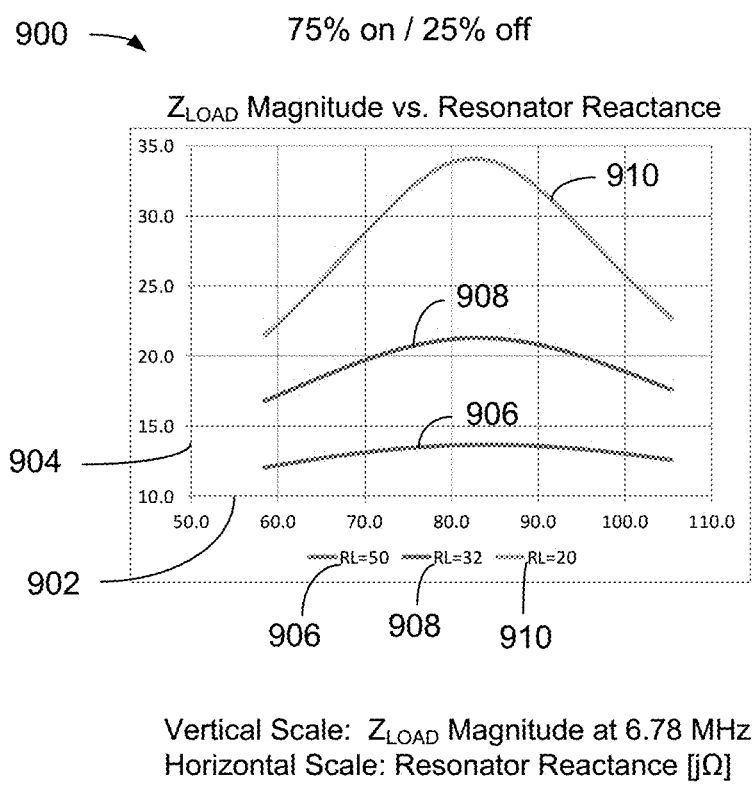
FIG. 9 is a graphical diagram showing the magnitude of the impedance presented to the amplifier circuit, Zload as a function of load resistance and resonator impedance of a class E2 amplifier.

FIG. 9 is a graphical diagram 900 showing the magnitude of the impedance presented to the amplifier circuit 410, Zload as a function of load resistance and resonator impedance of a class E2 amplifier. In this example, due to satisfying zero voltage switching (ZVS) conditions using the second harmonic current, load magnitude is centered and does allow comparable voltage and current stresses at each extreme of Zload reactance, effectively doubling the tolerable load impedance range compared to an equivalent class E amplifier.

The horizontal axis 902 shows the reactance of the resonator in the load circuit 440 (FIG. 4) and the vertical axis 904 shows the impedance of the load (Zload). The trace 906 shows the load impedance when RL (load resistance)=50 ohms; the trace 908 shows the load impedance when RL=32 ohms; and the trace 910 shows the load impedance when RL=20 ohms.

The graph 900 illustrates the magnitude of $Z_{LOAD}(j\omega_0)$ at the fundamental frequency (for example, 6.78 MHz) as a function of resonator reactance (XL) ranging from XL=58.5jΩ−105.4jΩ for three different RL based on the nominal 25% duty cycle design.

Note that the peak impedance occurs at the mid range of XL (approximately 80jΩ) and tapers off to a lower impedance value at both ends of the traces 906, 908 and 910. This shows that the lowest circulating currents through the transistor (switch 416, FIG. 4) and RF inductor (inductor 414, FIG. 4) are achieved at the mid range of XL, while circulating currents at the high XL and low XL should be substantially the same. At a load resistance of RL=50Ω, the circulating currents are almost the same across the entire XL range as shown by the trace 806.

Compared to the nominal 50% duty cycle design shown in FIG. 8, $Z_{LOAD}$ is higher in the nominal 25% duty cycle design implying lower circulating current in the transistor switch (switch 416, FIG. 4) and the RF inductor (414, FIG. 4) at nominal 25% duty cycle. Therefore, the losses should be lower using a nominal 25% duty cycle.

The diagram 900 illustrates an approximate factor of two resonator reactance advantage when operating in class E2 amplification vs. class E. The class E2 amplifier presents a switch load that is approximately symmetrical from the center of the resonator reactance range. In contrast, the load impedance of the class E amplifier increases with load reactance, consequentially, for the same the resonator reactance range, the switch is presented with approximately twice the load impedance variation.

Advantages of a class E2 amplifier over certain class E amplifier configurations include, for example, improved efficiency above a threshold over a range of complex impedance values, expanded reactance range, low voltage operation (a factor of ½ to ⅓ in dc voltage when compared to class E), and reduced harmonic filter complexity due to only using series inductance. The circuitry 400 (FIG. 4) need not provide full isolation at the second harmonic. It does however significantly reduce load variation at the second harmonic and presents a predominantly positive reactance to the amplifier circuit 410 at the second harmonic.

Figure 10:
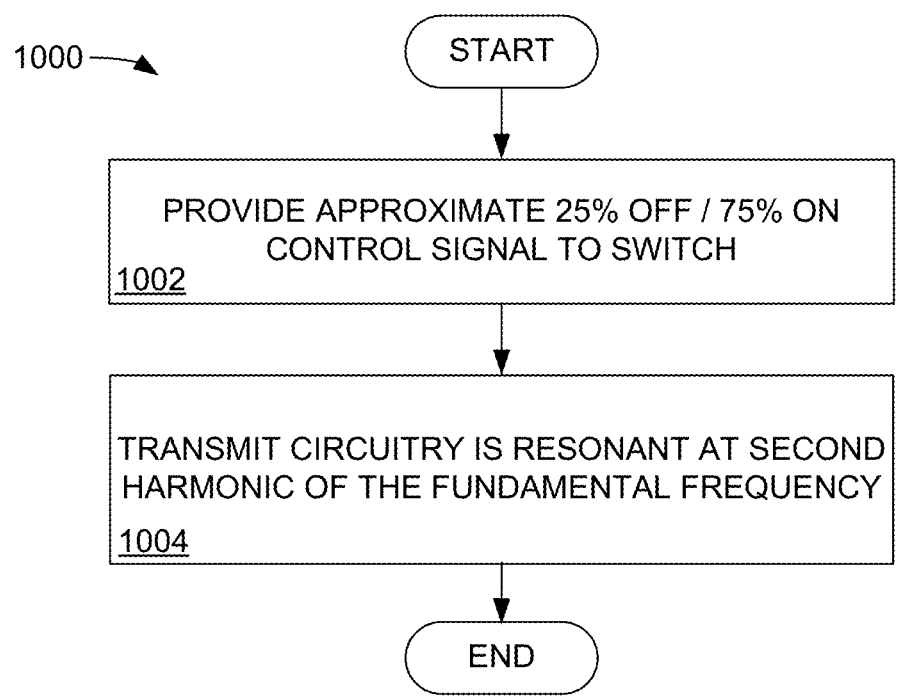
FIG. 10 is a flowchart illustrating an exemplary embodiment of a method for operating a class E2 amplifier circuit in a wireless power transmitter.

FIG. 10 is a flowchart illustrating an exemplary embodiment of a method 1000 for operating a class E2 amplifier circuit in a wireless power transmitter. The blocks in the method 1000 can be performed in or out of the order shown. The description of the method 1000 will relate to the various embodiments described herein.

In block 1002, a control signal having an approximate 25% off/75% on cycle is provided to an amplifier circuit. In an exemplary embodiment, the control signal may be provided to a semiconductor switch, such as the switch 416 (FIG. 4).

In block 1004, transmit circuitry is approximately resonant at a frequency that is a second harmonic of a fundamental frequency such that a current circulates in the amplifier at a second harmonic of the fundamental frequency. In an exemplary embodiment, the values of the components of the transmit circuitry are chosen such that the capacitor 418, inductor L1 432, and first capacitor C1 436, are resonant at the second harmonic, f2, of the fundamental frequency, f1.

Figure 11:
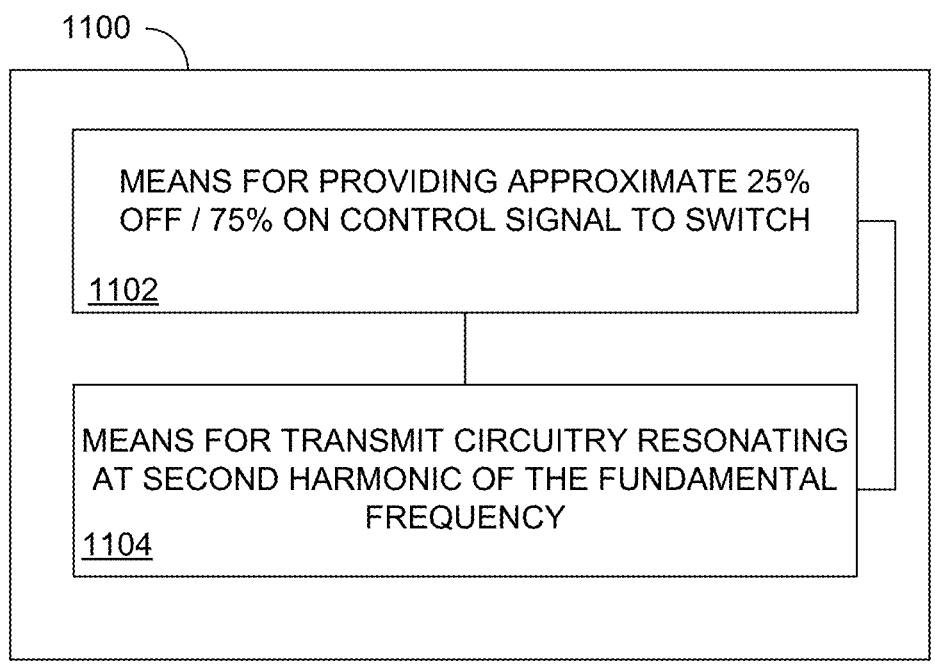
FIG. 11 is a functional block diagram of an apparatus for operating a class E2 driver circuit in a wireless power transmitter.

FIG. 11 is a functional block diagram of an apparatus 1100 for operating a class E2 driver circuit in a wireless power transmitter. The apparatus 1100 comprises means 1102 for providing a control signal having an approximate 25% off/75% on cycle to an amplifier circuit. In certain embodiments, the means 1102 for providing a control signal having an approximate 25% off/75% on cycle to an amplifier circuit can be configured to perform one or more of the function described in operation block 1002 of method 1000 (FIG. 10). In an exemplary embodiment, the means 1102 for providing a control signal having an approximate 25% off/75% on cycle to an amplifier circuit may comprise the input signal provided to the transmit circuitry described herein.

The apparatus 1100 further comprises means 1104 for the transmit circuitry resonating at a frequency that is a second harmonic of a fundamental frequency. In certain embodiments, the means 1104 for the transmit circuitry resonating at a frequency that is a second harmonic of a fundamental frequency can be configured to perform one or more of the function described in operation block 1004 of method 1000 (FIG. 10), including circulating a current in the amplifier at a second harmonic of the fundamental frequency. In an exemplary embodiment, the means 1104 for transmit circuitry resonating at a frequency that is a second harmonic of a fundamental frequency may comprise the transmit circuitry described herein.

Figure 12:
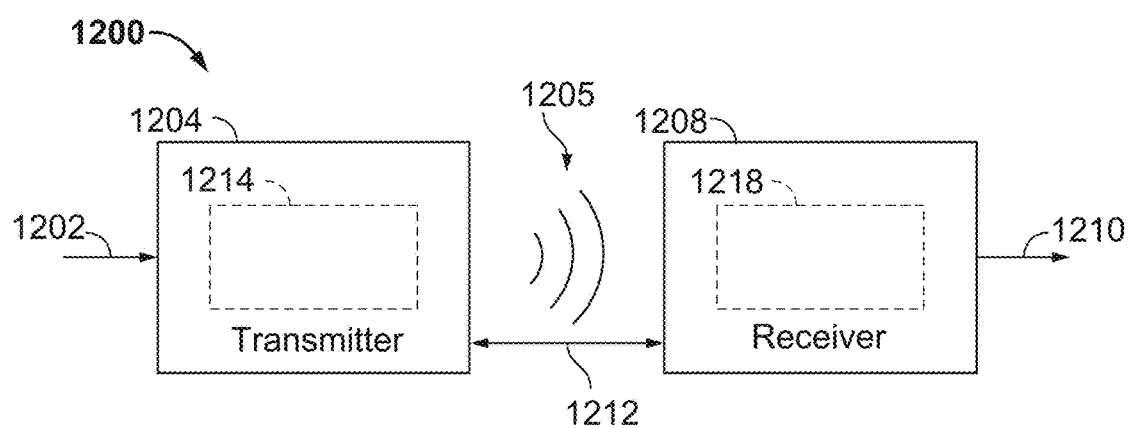
FIG. 12 is a functional block diagram of an exemplary wireless power transfer system, in which exemplary embodiments may be implemented.

FIG. 12 is a functional block diagram of an exemplary wireless power transfer system 1200, in which exemplary embodiments may be implemented. The exemplary wireless power transfer system 1200 is shown as one example of many applications for the class E2 amplifier circuit described herein, and is not intended to limit the application of the class E2 amplifier circuit in any of a number of applications.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

Input power 1202 may be provided to a transmitter 1204 from a power source (not shown) for generating a field 1205 (e.g., magnetic or species of electromagnetic) for providing energy transfer. A receiver 1208 may couple to the field 1205 and generate output power 1210 for storing or consumption by a device (not shown) coupled to the output power 1210. Both the transmitter 1204 and the receiver 1208 are separated by a distance 1212. In one exemplary embodiment, transmitter 1204 and receiver 1208 are configured according to a mutual resonant relationship. When the resonant frequency of receiver 1208 and the resonant frequency of transmitter 1204 are substantially the same or very close, transmission losses between the transmitter 1204 and the receiver 1208 are reduced. As such, wireless power transfer may be provided over larger distances in contrast to purely inductive solutions that may require large coils to be very close (e.g., millimeters). Resonant inductive coupling techniques may thus allow for improved efficiency and power transfer over various distances and with a variety of inductive coil configurations.

The receiver 1208 may receive power when the receiver 1208 is located in an energy field 1205 produced by the transmitter 1204. The field 1205 corresponds to a region where energy output by the transmitter 1204 may be captured by a receiver 1208. The transmitter 1204 may include a transmit antenna 1214 (that may also be referred to herein as a coil) for outputting an energy transmission. The receiver 1208 further includes a receive antenna 1218 (that may also be referred to herein as a coil) for receiving or capturing energy from the energy transmission. In some cases, the field 1205 may correspond to the "near-field" of the transmitter 1204. The near-field may correspond to a region in which there are strong reactive fields resulting from the currents and charges in the transmit antenna 1214 that minimally radiate power away from the transmit antenna 1214. In some cases the near-field may correspond to a region that is within about one wavelength (or a fraction thereof) of the transmit antenna 1214.

In accordance with the above therefore, in accordance with more particular embodiments, the transmitter 1204 may be configured to output a time varying magnetic field 1205 with a frequency corresponding to the resonant frequency of the transmit antenna 1214. When the receiver is within the field 1205, the time varying magnetic field 1205 may induce a voltage in the receive antenna 1218 that causes an electrical current to flow through the receive antenna 1218. As described above, if the receive antenna 1218 is configured to be resonant at the frequency of the transmit antenna 1214, energy may be more efficiently transferred. The AC signal induced in the receive antenna 1118 may be rectified to produce a DC signal that may be provided to charge or to power a load.

Figure 13:
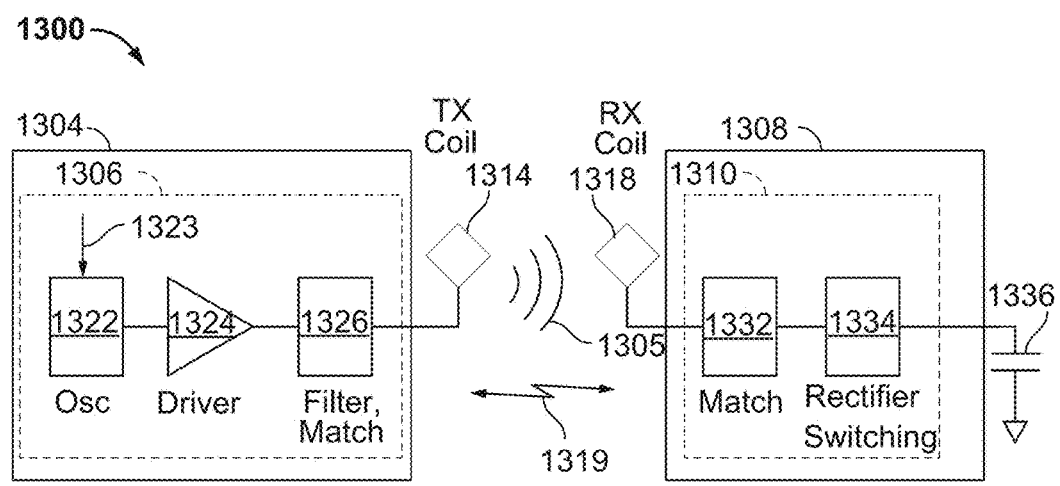
FIG. 13 is a functional block diagram of exemplary components in a wireless power transfer system that may be used in the wireless power transfer system of FIG. 12, in accordance with various exemplary embodiments.

FIG. 13 is a functional block diagram of exemplary components in a wireless power transfer system 1300 that may be used in the wireless power transfer system 1200 of FIG. 12, in accordance with various exemplary embodiments. The transmitter 1304 may include transmit circuitry 1306 that may include an oscillator 1322, a driver circuit 1324, and a filter and matching circuit 1326. The oscillator 1322 may be configured to generate a signal at a desired frequency, such as 468.75 KHz, 6.78 MHz or 13.56 MHz, that may be adjusted in response to a frequency control signal 1323. The oscillator signal may be provided to a driver circuit 1324 configured to drive the transmit antenna 1314 at, for example, a resonant frequency of the transmit antenna 1314. The driver circuit 1324 may be a switching amplifier configured to receive a square wave from the oscillator 1322 and output a sine wave. For example, the driver circuit 1324 may be a class E2 amplifier, as described herein. A filter and matching circuit 1326 may be also included to filter out harmonics or other unwanted frequencies and match the impedance of the transmitter 1304 to the impedance of the transmit antenna 1314. As a result of driving the transmit antenna 1314, the transmitter 1304 may wirelessly output power at a level sufficient for charging or powering an electronic device. As one example, the power provided may be for example on the order of 300 milliWatts to 5 Watts or 5 Watts to 40 Watts to power or charge different devices with different power requirements. Higher or lower power levels may also be provided.

The receiver 1308 may include receive circuitry 1310 that may include a matching circuit 1332 and a rectifier and switching circuit 1334 to generate a DC power output from an AC power input to charge a battery 1336 as shown in FIG. 13 or to power a device (not shown) coupled to the receiver 1308. The matching circuit 1332 may be included to match the impedance of the receive circuitry 1310 to the impedance of the receive antenna 1318. The receiver 1308 and transmitter 1304 may additionally communicate on a separate communication channel 1319 (e.g., Bluetooth, zigbee, cellular, etc.). The receiver 1308 and transmitter 1304 may alternatively communicate via in-band signaling using characteristics of the wireless field 1305.

The receiver 1308 may initially have a selectively disablable associated load (e.g., battery 1336), and may be configured to determine whether an amount of power transmitted by transmitter 1304 and received by receiver 1308 is appropriate for charging a battery 1336. Further, receiver 1308 may be configured to enable a load (e.g., battery 1336) upon determining that the amount of power is appropriate.

Figure 14:
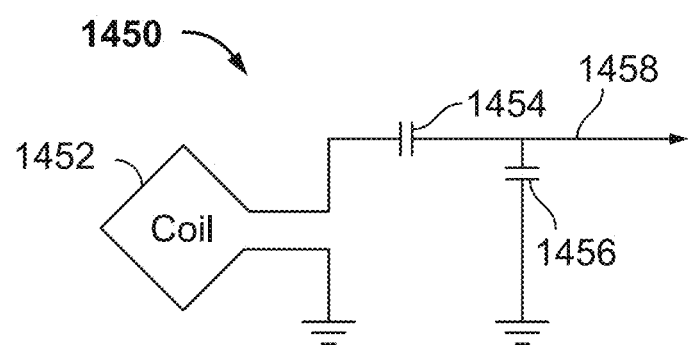
FIG. 14 is a schematic diagram of a portion of transmit circuitry or receive circuitry of FIG. 13 including a transmit or receive antenna, in accordance with exemplary embodiments.

FIG. 14 is a schematic diagram of a portion of transmit circuitry 1306 or receive circuitry 1310 of FIG. 13 including a transmit or receive antenna 1452, in accordance with exemplary embodiments. As illustrated in FIG. 14, transmit or receive circuitry 1450 used in exemplary embodiments including those described below may include an antenna 1452. The antenna 1452 may also be referred to or be configured as a "loop" antenna 1452. The antenna 1452 may also be referred to herein or be configured as a "magnetic" antenna or an induction coil. The term "antenna" generally refers to a component that may wirelessly output or receive energy for coupling to another "antenna." The antenna 1452 may also be referred to as a coil of a type that is configured to wirelessly output or receive power. As used herein, an antenna 1452 is an example of a "power transfer component" of a type that is configured to wirelessly output and/or receive power. The antenna 1452 may be configured to include an air core or a physical core such as a ferrite core (not shown).

The antenna 1452 may form a portion of a resonant circuit configured to resonate at a resonant frequency. The resonant frequency of the loop or magnetic antenna 1452 is based on the inductance and capacitance. Inductance may be simply the inductance created by the antenna 1452, whereas, capacitance may be added to create a resonant structure (e.g., a capacitor may be electrically connected to the antenna 1452 in series or in parallel) at a desired resonant frequency. As a non-limiting example, capacitor 1454 and capacitor 1456 may be added to the transmit or receive circuitry 1450 to create a resonant circuit that resonates at a desired frequency of operation. For larger diameter antennas, the size of capacitance needed to sustain resonance may decrease as the diameter or inductance of the loop increases. As the diameter of the antenna increases, the efficient energy transfer area of the near-field may increase. Other resonant circuits formed using other components are also possible. As another non-limiting example, a capacitor (not shown) may be placed in parallel between the two terminals of the antenna 1452. For transmit antennas, a signal 1458 with a frequency that substantially corresponds to the resonant frequency of the antenna 1452 may be an input to the antenna 1452. For receive antennas, the signal 1458 may be the output that may be rectified and used to power or charge a load.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

In view of the disclosure above, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the FIGS. which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and Blu-Ray disc where disks usually reproduce data magnetically, while discs reproduce data optically with lasers. Combinations of the above should also be included within the scope of computer-readable media.

Although selected aspects have been illustrated and described in detail, it will be understood that various substitutions and alterations may be made therein without departing from the spirit and scope of the present invention, as defined by the following claims.

The invention claimed is:

1. An amplifier, comprising:
   an amplifier circuit comprising a switch, the switch configured to provide an output signal responsive to an input signal, the output signal comprising a first output signal at a fundamental frequency and a second signal at a second harmonic of the fundamental frequency, the input signal configured to control the switch according to a nominal 25% off, 75% on cycle;
   a filter circuit configured to control an impedance presented to the amplifier circuit; and
   a load circuit, at least a part of which is configured to combine with the filter circuit to form an impedance transformation circuit configured to be resonant at the second harmonic of the fundamental frequency, the impedance transformation circuit also configured to form a ¼ wave transformation circuit at the fundamental frequency.

2. The amplifier of claim 1, wherein the load circuit and the filter circuit present a predominantly positive reactance to the amplifier circuit at the second harmonic of the fundamental frequency.

3. The amplifier of claim 1, wherein the amplifier circuit circulates a current through a portion of the filter circuit at the second harmonic of the fundamental frequency.

4. The amplifier of claim 1, wherein the amplifier circuit circulates a current through the load circuit at the fundamental frequency.

5. The amplifier of claim 1, wherein at a given load, second harmonic impedance at the fundamental frequency is presented to the amplifier circuit.

6. The amplifier of claim 1, wherein the impedance transformation circuit presents an impedance of the load circuit to the amplifier circuit at the fundamental frequency, and presents the impedance of the load circuit to the amplifier circuit at the second harmonic of the fundamental frequency, such that a current at the second harmonic of the fundamental frequency is substantially insensitive to the impedance of the load circuit.

7. The amplifier of claim 1, wherein a current circulates through the amplifier circuit at a second harmonic of the fundamental frequency, such that an operating efficiency of the amplifier circuit is substantially centered around a zero reactance point.

8. The amplifier of claim 1, wherein an efficiency of the amplifier circuit is maintained above a threshold over a range of complex impedance values.

9. The amplifier of claim 1, wherein the amplifier circuit circulates a current through the load circuit at the fundamental frequency and the current provides charging energy.

10. The amplifier of claim 1, wherein the amplifier circuit circulates a current through the load circuit at the fundamental frequency and wherein the load circuit comprises a coil configured to generate a magnetic field for wirelessly transferring power to one or more receiver devices in response to the input signal.

11. The amplifier of claim 1, wherein the impedance transformation circuit comprises selected inductive and capacitive components of the filter circuit and the load circuit.

12. The amplifier of claim 11, wherein the impedance transformation circuit comprises first and second inductances, first and second capacitances, and a load inductance configured to be resonant at the fundamental frequency.

13. The amplifier of claim 11, wherein the impedance transformation circuit comprises first and second inductances, and a capacitance configured to be resonant at the second harmonic of the fundamental frequency.

14. An apparatus for wirelessly transmitting power via a wireless field, the apparatus comprising:
    an amplifier circuit comprising a switch, the switch configured to provide an output signal responsive to an input signal, the output signal comprising a first output signal at a fundamental power transmit frequency and a second signal at a second harmonic of the fundamental power transmit frequency, the input signal configured to control the switch according to a nominal 25% off, 75% on cycle;
    a filter circuit; and
    a load circuit, wherein the filter circuit or at least a part of the load circuit combined with the filter circuit forms an impedance transformation circuit configured to be resonant at the second harmonic of the fundamental power transmit frequency, the impedance transformation circuit also configured to form a ¼ wave transformation circuit at the fundamental frequency.

15. The apparatus of claim 14, wherein the load circuit and the filter circuit present a predominantly positive reactance to the amplifier circuit at the second harmonic of the fundamental power transmit frequency.

16. The apparatus of claim 14, wherein the amplifier circuit circulates a current through a portion of the filter circuit at the second harmonic of the fundamental power transfer frequency.

17. The apparatus of claim 14, wherein the amplifier circuit circulates a current through the load circuit at the fundamental power transfer frequency.

18. The apparatus of claim 14, wherein at a given load, second harmonic impedance at the fundamental power transfer frequency is presented to the amplifier circuit.

19. A method for operating an amplifier, the method comprising:
    providing an output signal responsive to an input signal, the output signal comprising a first output signal at a fundamental frequency and a second signal at a second harmonic of the fundamental frequency, the input signal comprising a nominal 25% off, 75% on cycle;
    circulating a first current in the amplifier at the fundamental frequency; and
    simultaneously with the first current, circulating a second current in the amplifier at a second harmonic of the fundamental frequency.

20. The method of claim 19, further comprising presenting a predominantly positive reactance to the output signal at the second harmonic of the fundamental frequency.

21. The method of claim 19, wherein an impedance presented to the output signal substantially comprises impedance at the second harmonic of the fundamental frequency.

22. The method of claim 19, further comprising:
    presenting an impedance to the output signal at the fundamental power transfer frequency; and
    presenting the impedance to the output signal at the second harmonic of the fundamental power transfer frequency, such that a current at the second harmonic of the fundamental power transfer frequency is substantially insensitive to the impedance.

23. The method of claim 19, wherein circulating the second current at the second harmonic of the fundamental frequency causes an operating efficiency to be substantially centered around a zero reactance point.

24. The method of claim 19, wherein circulating the first current at the fundamental frequency provides charging energy.

25. A device, comprising:
  means for providing an output signal responsive to an input signal, the output signal comprising a first output signal at a fundamental frequency and a second signal at a second harmonic of the fundamental frequency, the input signal comprising a nominal 25% off, 75% on cycle;
  means for circulating a first current at the fundamental frequency; and
  means for simultaneously circulating a second current at a second harmonic of the fundamental frequency.

26. An amplifier circuit for driving a load circuit, the amplifier circuit comprising:
  a switching circuit configured to switch between a conductive state and a non-conductive state responsive to an input signal, the switching circuit electrically connected between a choke inductor in series with a voltage source and a ground connection, the switching circuit configured to provide an output signal responsive to an input signal;
  an input circuit electrically coupled to the switching circuit and configured to generate the input signal, the input signal generated to be an oscillating signal at a fundamental frequency having a substantially nominal 25% off, 75% on cycle; and
  an impedance transformation circuit electrically coupled between a node that is between the switching circuit and the choke inductor and the load circuit, at least a portion of the impedance transformation circuit configured to form a resonant circuit that is resonant at the second harmonic of the fundamental frequency, the impedance transformation circuit also configured to form a ¼ wave transformation circuit at the fundamental frequency.

27. The amplifier circuit of claim 26, wherein the impedance transformation circuit presents a predominantly positive reactance to the switching circuit at the second harmonic of the fundamental frequency.

28. The amplifier circuit of claim 26, wherein at a given load, second harmonic impedance of the fundamental frequency is presented to the switching circuit.

29. The amplifier circuit of claim 26, wherein a first current circulates through the load circuit at the fundamental frequency.

30. The amplifier circuit of claim 29, wherein the load circuit comprises a coil configured to generate a magnetic field for wirelessly transferring power to one or more receiver devices in response to the input signal.

31. The amplifier circuit of claim 26, wherein a second current circulates through a portion of the impedance transformation circuit at the second harmonic of the fundamental frequency.

32. The amplifier circuit of claim 31, wherein the impedance transformation circuit presents an impedance of the load circuit to the switching circuit at the fundamental frequency, and presents the impedance of the load circuit to the switching circuit at the second harmonic of the fundamental frequency, such that a current at the second harmonic of the fundamental frequency is substantially insensitive to the impedance of the load circuit.

33. The amplifier circuit of claim 26, wherein the impedance transformation circuit comprises first and second inductances, first and second capacitances, and a load inductance configured to be resonant at the fundamental frequency.

34. The amplifier circuit of claim 26, wherein the impedance transformation circuit comprises first and second inductances, and a capacitance configured to be resonant at the second harmonic of the fundamental frequency.

* * * * *